United States Patent [19]

Beale

[11] Patent Number: 4,757,271
[45] Date of Patent: Jul. 12, 1988

[54] COMPOSITE AUDIO AMPLIFIER

[75] Inventor: David G. Beale, Kalamunda, Australia

[73] Assignee: John Dumergue Charters, Midland, Australia; a part interest

[21] Appl. No.: 36,053

[22] PCT Filed: Jul. 22, 1986

[86] PCT No.: PCT/AU86/00208
§ 371 Date: May 11, 1987
§ 102(e) Date: May 11, 1987

[87] PCT Pub. No.: WO87/00709
PCT Pub. Date: Jan. 29, 1987

[30] Foreign Application Priority Data

Jul. 22, 1985 [AU] Australia .................. PH1564
Jul. 22, 1985 [AU] Australia .................. PH1566

[51] Int. Cl.$^4$ .................................................. H03F 3/45
[52] U.S. Cl. .................................. 330/255; 330/266; 330/289
[58] Field of Search .......... 330/252, 255, 256, 261, 330/263, 289, 296, 297, 311, 266, 267

[56] References Cited

U.S. PATENT DOCUMENTS 4,638,260 1/1987 Hanley .................. 330/296 X

Primary Examiner—Eugene R. LaRoche
Assistant Examiner—Steven J. Mottola
Attorney, Agent, or Firm—Townsend & Townsend

[57] ABSTRACT

Audio amplifier comprising symmetrical, dual polarity power supply and class AB audio amplifier circuit, said supply comprising first positive (86) and negative (85) and second positive (83) and negative (84) unregulated DC inputs; positive and negative regulated outputs and common output (87); first regulator circuit including transistor (62) having its emitter connected to said first negative unregulated DC input; a second regulator circuit including transistor (61) having its emitter connected to said positive unregulated DC input and both collectors connected to said common output, each transistor having a pass resistor, said first circuit deriving a reference from said negative regulated output and said second circuit deriving a reference from said positive regulated output said first and second regulator circuit deriving power from said positive regulated output and common and said negative regulated output and common respectively; said amplifier circuit comprising primary operational amplifier (12) driving complementary power transistor output stages (9, 10); bias adjustment means responsive to temperature of the output stages; the signal output of said operational amplifier being fed to complentary symmetric arms of a network shunting base current from said output stages when said signal exceeds a threshold and, at the same time, said power output drops below a threshold; said network allowing transient overloads.

13 Claims, 14 Drawing Sheets

COMPOSITE AUDIO AMPLIFIER

TECHNICAL FIELD

The present invention relates to an amplifier circuit and, in particular, to a circuit comprising an amplifier section, a power supply section and a preamplifier section, all sections working together to provide an amplifier suited for use as a high fidelity audio amplifier.

BACKGROUND ART

Many audio amplifier circuits are known. However, output from such devices typically suffers to a greater or lesser degree from instability in the biasing of the output stages and/or distortion arising from imperfections in the DC power supply for the power amplifier stage.

Further, in many amplifier circuits, either no provision is made for coping with overload conditions (either by way of high amplitude inputs and/or by way of very low impedance between the output(s) and common). Where provision is made, the protection is frequently of the "after the event" type wherein damaging levels of current, voltage or temperature are reached before the protection operates.

It is an object of the present invention to overcome, or substantially ameliorate, the abovementioned disadvantages.

DISCLOSURE OF INVENTION

In one broad form the invention provides. A composite audio amplifier comprising at least one symmetrical, dual polarity audio amplifier power supply and a glass AB audio amplifier circuit, said symmetrical, dual polarity audio amplifier power supply comprising first positive and negative and second positive and negative unregulated DC inputs;

positive and negative regulated outputs and a common output;

a first and second regulator circuit;

said first regulator circuit including at least one pass transistor having its emitter connected to said first negative unregulated DC input and its collector connected to said common ouput, said second regulator circuit including at least one pass transistor having its emitter connected to said positive unregulated DC input and its collector connected to said common output;

each said pass transistor having a pass resistor connected between the emitter and collector of said pass transistor;

said first regulator circuit deriving a reference signal from said negative regulated output and said second regulator circuit deriving a reference from said positive regulated output;

said first and second regulator circuit deriving power from said positive regulated output and common and said negative regulated output and common respectively;

said class AB audio amplifier circuit comprising in combination a primary operational amplifier driving complementary power transistor output stages;

bias current for said complementary power transistor output stages including bias current adjustment means to adjust said bias current in response to the temperature of at least one of a power transistor forming part of said complementary power transistor output stages;

the signal output of said primary operational amplifier being fed to complementary symmetric first and second arms of a current shunt network, said current shunt network adapted to shunt base current from said complementary power transistor output stages when said signal output of said primary operational amplifier exceeds a preset maximum threshold and, at the same time, said signal from said power output drops below a preset minimum threshold;

said current shunt network adapted to allow transient overload conditions.

In a preferred embodiment of the invention the amplifier differs from the conventional amplifier by having an efficient circuit for preventing damage to the output transistors and loud speakers by sensing overloads and short circuits at its output and by stabilising the effects of temperature. The result is that bias can be increased to a level which would be damaging to a conventional amplifier thus-producing exceptionally high fidelity performance where the amplifier is used as an audio amplifier.

In particular, in a preferred embodiment, extremely high fidelity has been achieved by an unusually high speed capability, linearity and absence of cross-over distortion which had been achieved by retaining functional simplicity with a superior bias method including temperature stabilisation.

In a preferred embodiment, (in contrast to the conventional approach to amplifier protection which is to detect excessive currents and then either contain them at a nominal maximum or turn them off), the amplifier operates as a virtual impedance detecting system and prevents rather than reacts to otherwise damaging levels of current, voltage and/or temperature.

In a preferred form, the amplifier of the present invention has associated with it a voltage regulator which is specifically designed in conjunction with the amplifier to maximize power delivery and, at the same time, to minimize any spurious inputs introduced into the amplifier due to power supply imperfection.

Features of a preferred embodiment of a regulator to be used in conjunction with the amplifier of the preferred embodiment include:

(i) The reduction of voltages which are dropped across common lines which would then add to signal inputs of audio amplifiers using the regulator.

(ii) Fine regulation accuracy.

(iii) High peak current capability relative to the average current.

(iv) High speed response to rapid changes in current flow requirements thus enabling the amplifier to reproduce accurately.

(v) Low minimum inherent drop of voltage across the regulator especially during high peak current flow.

(vi) Neither short-circuits nor overloads can cause damage to the regulator.

(vii) If either polarity supply should be reduced significantly for any reason both polarities should reduce to zero simultaneously. This protects loudspeakers against amplifiers putting out large standing direct currents.

(viii) Stability (freedom from oscillations) of the output.

(ix) Low parts-count, simplicity and ease of manufacture, well-known and easily-available parts.

(x) Drive for the regulators is taken from the output side of each polarity's pass transistors which provides a lower noise supply than drive derived from the input side, besides (v) above.

BRIEF DESCRIPTION OF THE DRAWINGS

Preferred embodiments of the present invention will now be described with reference to the drawings in which.

MODES OF CARRYING OUT THE INVENTION

Figure 1:
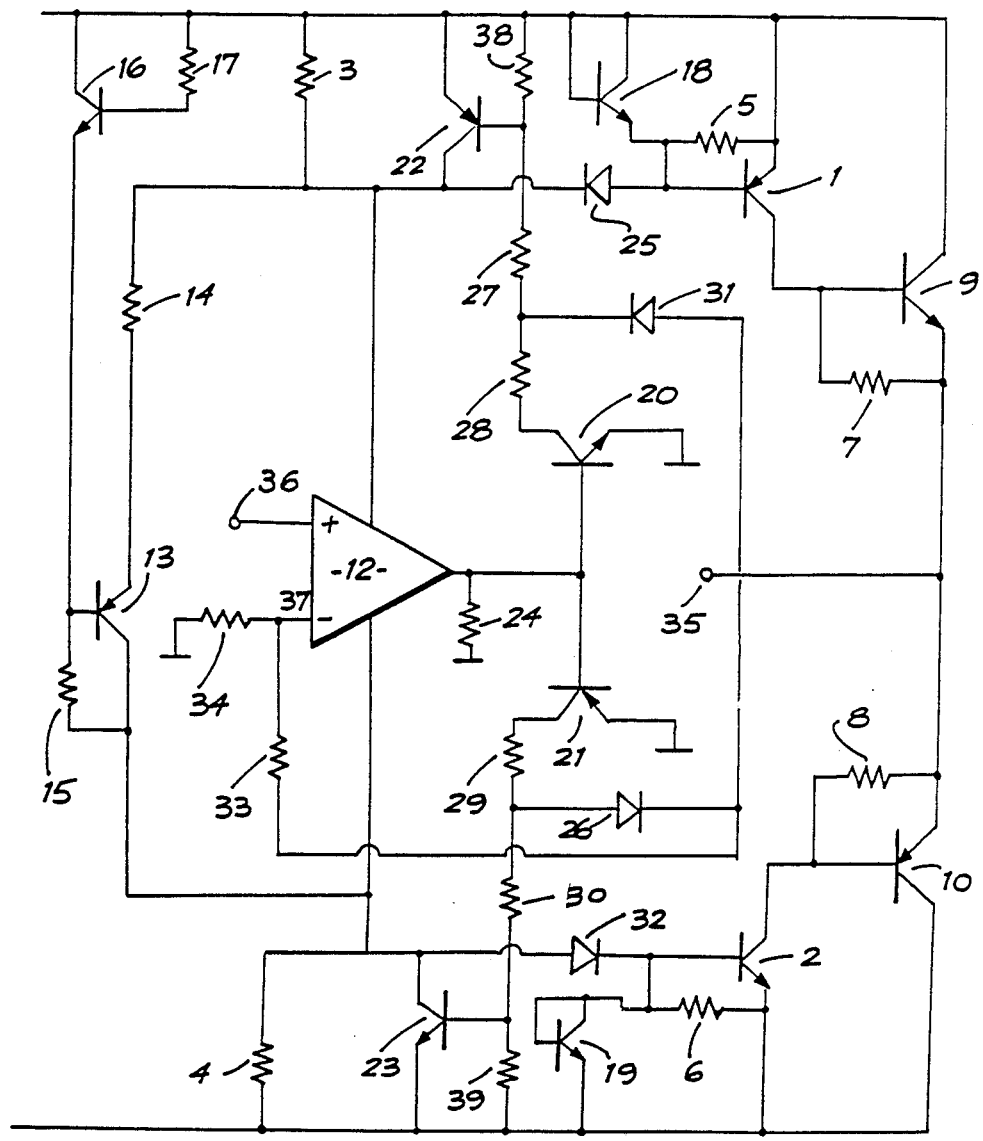
FIG. 1 is a circuit diagram of a preferred embodiment of the present amplifier.

Refering to FIG. 1, the power-amplifier circuit shown is basically a standard circuit. However to make it able to be used in practice, the considerations of bias to prevent crossover distortion and the prevention of thermal runaway have presented in the past nearly insurmountable difficulties. Overload, short-circuit and heat protection is achieved in this amplifier.

Normally, in conventional amplifiers, the resistor values in series with the operational amplifier integrated circuit and the emitter-base resistors, are adjusted to suit the standing current-consumption of the integrated circuit (I.C.) so that the transistors are biased just enough to avoid crossover distortion, but not enough to overload them. In practice the negative temperature coefficient of the emitter-base voltage on the transistors ensures that without adequate precautions any bias or load-current will increase temperature, which increases bias, and so on until the transistors are either hot enough to break or the power-supply is unable to provide additional current.

In FIG. 1 is shown the circuit diagram of a first embodiment. The resistors which develop the emitter-base bias voltage for the driver-transistors 1 & 2 are resistors 3 & 4. The current resulting is also bypassed by resistors 5 & 6, 7 & 8, which are standard towards temperature stability for transistors 1 & 2, 9 & 10. In this amplifier the current through I.C. 12 is minimal towards biasing the transistors, instead of transistor 13 with current-limiting resistor 14 conducts by virtue of turn-on resistor 15 supplying more than enough bias for the system such that crossover distortion is eliminated for all practical purposes.

Temperature stability is attained by having transistor 16 mounted with its metal collector-heat-sink physically common to the collector of power-output transistor 9, and transistor 16's emitter connected to the base of bias-transistor 13 so as to be able to short out any excessive turn-on current from resistor 15. Diodes 25 and 32 ensure that the bias voltage thresholds are higher, but the signal current requirements are the same as without diodes 25 and 32.

An adjustment needed is variable-resistor 17 which is decreased until at a low temperature only the excessive drive for the bias current is conducted away through transistor 16.

As the temperature of the system increases especially on the power transistors, transistor 16 conducts increasingly, the effect being to have the bias current remain within safe, usable limits.

Additions shown to the system are transistors 18 and 19 used as temperature-variable resistors on the emitter-base connections of driver-transistors 1 and 2. Transistors 18 and 19 have a higher standing emitter-base threshold voltage than transistors 1 and 2, but their leakage is temperature dependent, so that without shorting signal-current they still act as temperature-variable resistors, which are mounted with heat-sink conduction physically close to transistors 1 and 2.

Signals arriving at the non-inverting input 36 of I.C. 12 are amplified by it to result in current through dummy-load resistor 24. The currents pass through driver-transistors 1 and 2 as signal currents, and these signals, phase-split by I.C. 12, cause output current to be available at the junction of the emitters of transistors 9 and 10 - output 35.

The voltage developed by current available at 35, across a load resistor, is divided by resistors 33 and 34, such that operational amplifier I.C. 12 ceases to increase the current thus amplified when the voltage at 37 virtually equals the voltage at 36. Thus, into a suitable load resistor at 35, the voltage at 35 is a convenient multiple of the voltage at 36, with a light time-delay.

Within limits safe for the load (loudspeakers) and the amplifier's transistors and power-supply, the I.C. resistor 24 will only reflect normal signal-drive-currents through the power-supply inputs of I.C. 12, and the voltages developed across 24 will not turn on transistors 20 or 21. The output 35 voltage is fed by diodes 31 and 26, such that a voltage-division using resistors 27, 28, 29, 30, 38 & 39 is enough for 22 & 23 via 38 & 39 to leave these transistors off during normal signal-overload conditions ("clipping") at output 35. When the multiple of the signal exceeds the available power-supply voltage, I.C. 12 turns on fully because the input signal at 36 cannot be virtually equalled by divided-output-voltage at input 37. Transistors 20 and 21 can turn on in turn as the polarity of the signal changes, but, unless the voltage at 35 drops below values calculated by the dividers 27–39 above, transistors 22 and 23 remain turned off, and current continues to be available at output 35. If either too low a voltage is developed at 35, or a short-circuit to common happens, transistors 20 & 22 and 21 & 23 turn on, by-passing the drive for output current. Thus, when such an overload condition exists at the output 35, then, before the I.C. 12 can increase drive current and output current to unsafe amounts, current for I.C. 12 is supplied by faster transistors 22 or 23 depending on the polarity of the overloading signal.

The output voltage is then returned to zero at 35 until the signal crosses zero at input 36. If the overload persists during the signal's alternative polarity, the sequence is repeated with I.C. 12's current supplied via a by-pass transistor instead of a driver transistor at a speed faster than a drive-output transistor-combination can turn on because of the higher relative speed of the I.C. 12 and the small signal transistors compared with the driver-output transistors.

Thus, under specifiable overload conditions the output is turned off before it reaches any unwanted levels of voltage or current. By sensing the efforts of I.C. 12 to respond to signals at 36 in the absence of a return-voltage at input 37, an otherwise damaging amount of current availability at 35 is prevented.

Figure 2:
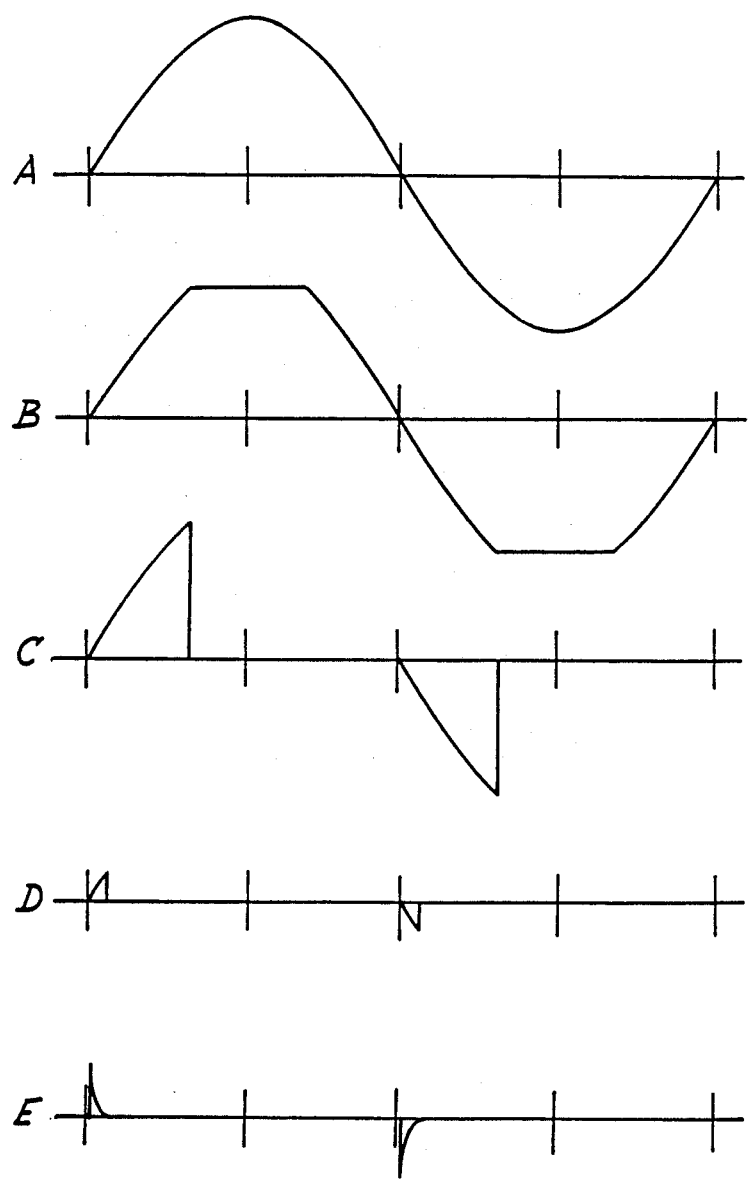
FIG. 2 shows graphical representations of voltage and current conditions at nominated points in the circuit of the preferred emboidment.

FIG. 2 sections A, B, C, D and E show graphs of different conditions of voltage, current and time for the input voltage signal at 36 and the output voltage and current at 35. The graphs are for 360° of a sine-wave from 0° to 360°.

The horizontal axes represent a common time from zero starting on the left to the end of each cycle on the right.

The vertical axes represent current and/or voltage with for each section positive increasing towards the top and negative increasing towards the bottom of the page, separately for each of A, B, C, D & E.

FIG. 2A represents both input voltage at 36 and output voltage and current at 35 into a normal constant and acceptable load resistance. The graphs for impedance under real conditions into a loudspeaker depend on the characteristics of the loudspeaker's inductance and reverse electro-motive-force resulting from its ability to generate voltages through inertia of the moving coil in the magnetic field of the loudspeaker. Such a graph would vary with the loudspeaker's type and is not shown here. The principle is the same to illustrate the preferred embodiment in that adverse currents through the load and adverse voltage, current, time and heat conditions in the amplifier are presented.

FIG. 2B shows the graph of a voltage input 2A to the amplifier if either input is too large or the output resistance load at 35 is too small for the available supply voltages to the amplifier and the voltages normally dropped across the output transistors and driver transistors 1, 2, 9 & 10 and any protective series resistance not shown in FIG. 1A for transistors 1 & 2.

FIG. 2C shows the voltage and current at 35 for a signal input the same as graph FIG. 2A with too low a resistance as a load at 35. Note that as soon as the current resulting from the input voltage multiplied by the amplifier reaches an unacceptable level as sensed by the transistors firstly 20 and secondly 21, both voltage and current at output 35 are reduced to zero until the next zero crossing of the input signal voltage.

FIG. 2D shows the graph of output voltage only into as close as practical to a short-circuit (zero impedance). In practice, if the impedance was zero, there will still be a tiny current, though not as shown in the graph, for the few fractions of a microsecond while the transistors switch. However, the output and driver transistors 9, 10, 1 & 2 do not reach damaging levels of current and voltage drop, because transistors 20, 21, 22 & 23 operate faster than 1, 2 9 & 10.

FIG. 2E shows the worst-case for fast input signals, where current output at 35 rises very quickly because of a short-circuit to common. However it reduces to zero until the next zero-crossing of the input signal represented by graph 2A, well within the voltage, time and current limits before "second breakdown" of the transistors or their thermal limits, according to the calculated values of 27, 28, 29, 30, 38 & 39.

An option for calculating correct overload limits is to place voltage-divider resistors on the output of I.C. 12, so that higher currents through resistor 24 can pass before the thresholds of turn-on for transistors 20 & 21 are reached.

Figure 3:
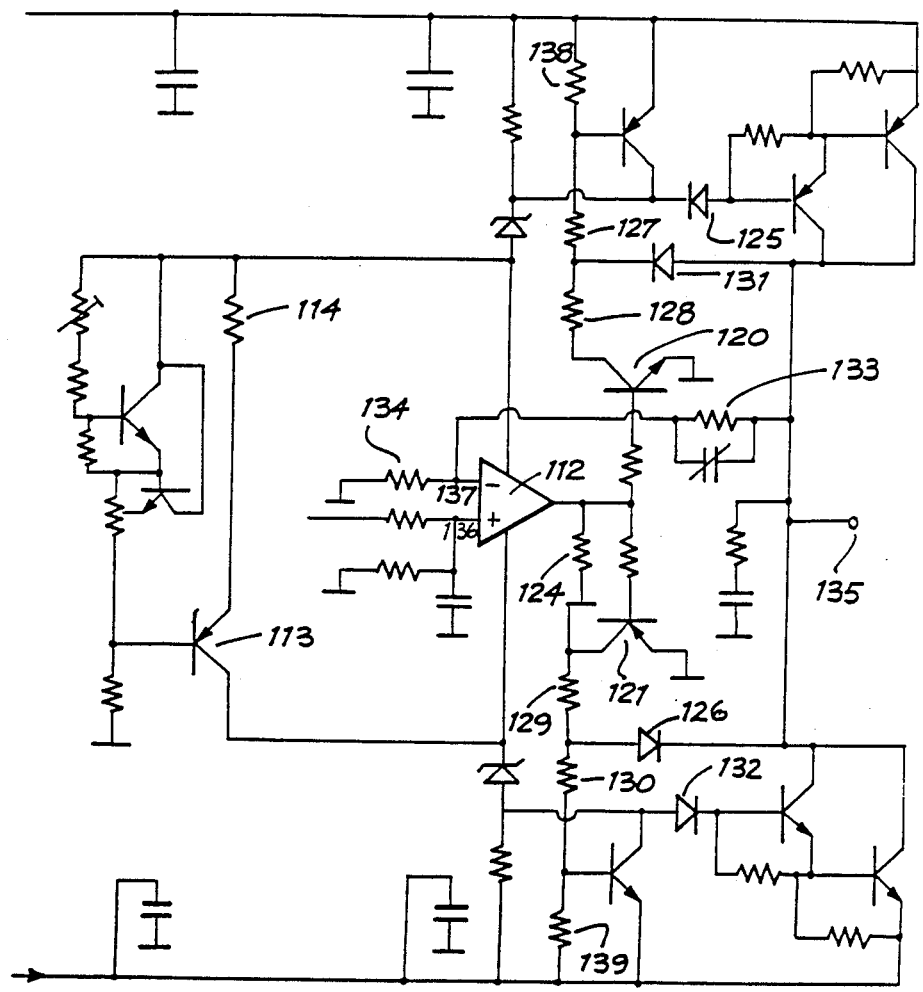
FIG. 3 shows more detail of the circuit of the power amplifier of the first preferred embodiment.

FIG. 3 shows a modified form of the amplifier of FIG. 1. Corresponding components are numbered with the same least significant digits as for FIG. 1.

Figure 4:
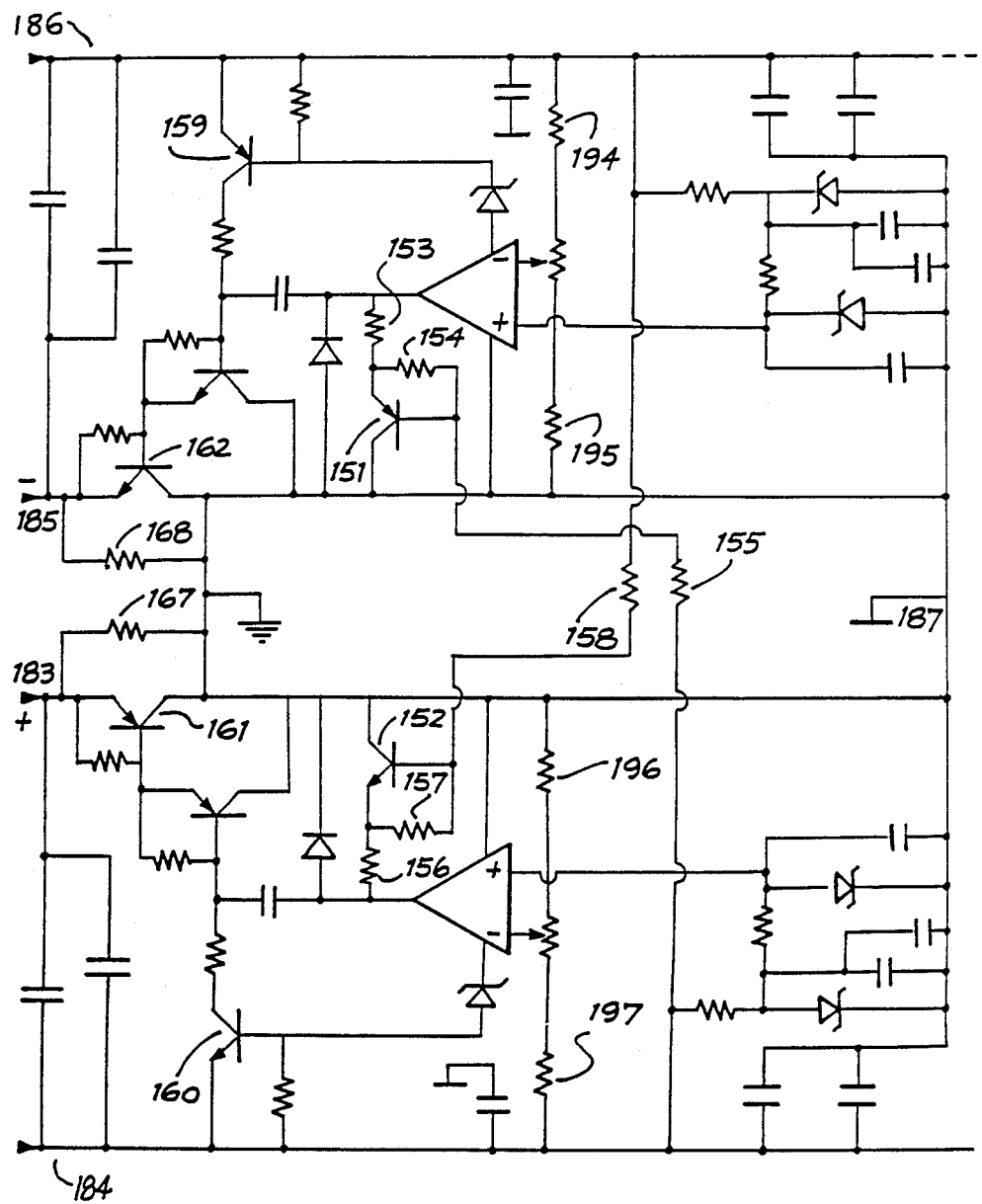
FIG. 4 shows the circuit diagram of a power supply suitable for use with the amplifier circuit of the first embodiment.

FIG. 4 depicts the general circuit layout of a power supply suitable for use with the amplifier of the first embodiment.

Figure 5:
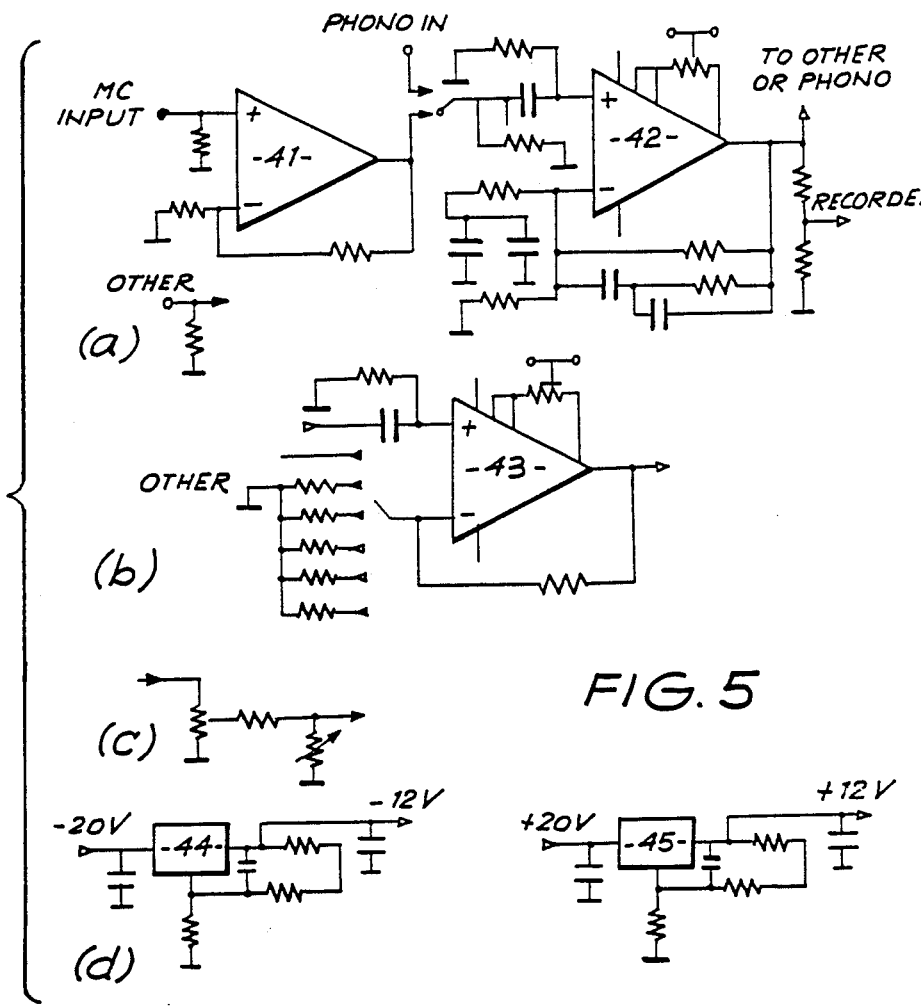
FIG. 5 is the circuit diagram of a pre-amplifier suitable for use with the amplifier of the 1st embodiment.

FIG. 5 depicts preamplifier sections, voltage division networks and regulator circuits suitable for use with the amplifier of the first embodiment. In particular, operational amplifiers 41, 42 and 43 to allow for inputs of varying impedance level. (FIGS. 5(a) and 5(b).

FIG. 5(c) depicts a voltage division network for volume control which will typically be realised as a dual circuit with variable controls operating in tandem for the left and right chanels of a stereo amplifier system.

FIG. 5(d) shows typical voltage regulator circuits using voltage regulator I.C.s as components 44 and 45.

Figure 6:
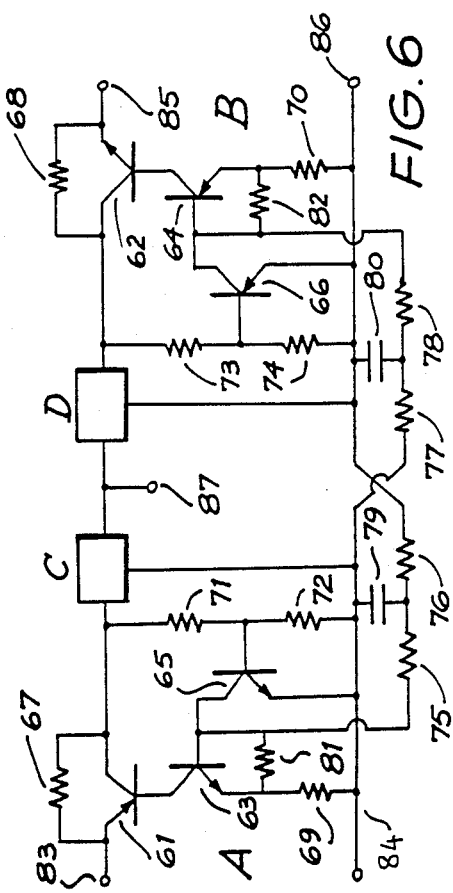
FIG. 6 (Section A, B, C, D) depict a block circuit diagram of a first embodiment of a voltage regulator suitable for supplying the amplifiers of the preferred emboidment.

Referring to FIG. 6 wherein a first embodiment of a preferred voltage regulator in block diagram form is shown:

This voltage regulator has the drive for the transistors taken from the output of the regulators of opposite polarity instead of from each polarity's own input from the rectifiers and smoothing tank capacitors, thus (a) helping to eliminate ripple and (b) the risk of audio amplifiers getting only one polarity of two needed, which at the amplifier's outputs damages loudspeakers if one power supply fails, as well as the other advantages described below.

The second quality of audio amplifiers is largely dependent on the ability of the power supply voltages to remain constant during varying quantities of current being demanded of them. The main reason for this is because of the practical inability of amplifiers to isolate their inputs from the power supplies which have voltage variations which tend to act as virtual inputs in addition to legitimate signal inputs to the amplifiers. This voltage regulator has features which make it more suitable than others available for audio amplifiers.

FIG. 6 Part A shows a stage of the regulator which has the unregulated input positive at the emitter of transistor 1 and the output on that transistor's collector.

FIG. 6 Part B shows a stage of the regulator which has the unregulated input negative at the emitter of transistor 2 and the output on that transistor's collector.

Instead of being what are usually "common" lines, 24 & 26 are the permanent "active" lines, and regulation is done on the way to outputting at common (usually ground also).

FIG. 6 Part C and FIG. part D are final stages of regulation and may be the same circuitry as FIG. 1A and FIG. 1B respectively. The outputs of both FIG. 1C and FIG. 1D are connected because the transistor's outputs are on their cases which are the collectors, and for both electrical and manufacturing convenience these can be mounted to the common case/ground without insulating washers.

Features of the preferred embodiment of FIG. 6 include:

(i) The avoidance of the dropping of voltages across common lines is assisted by having the pre-regulators embodied in FIGS. 6A and B independent of each other until the final common point 87 at outputs of FIG. 6 Parts C and D.

(ii) Fine voltage-regulation accuracy is achieved by having the stages driven by current derived from the regulator outputs instead of from the inputs 83 and 85 which are unregulated. Because inputs to the regulator (83 and 85) are at the emitters there is not the amplification of input noise by the pass transistors 61 and 62. Transistors 65 and 66 can be chosen, or pairs used, for extra high gain which improves voltage accuracy. Voltage accuracy and long term temperature stability can be improved by transistors 65 and 66 being replaced by for example operational amplifiers addressed by voltage references. However this method usually results in slower response to fast changes in current requirements at the output, and so the transistors 65 and 66 are better for audio amplifier applications.

(iii) High peak currents are easier to sustain through this circuitry for the same reasons as described in (v) below.

(iv) High speed response results because discrete transistors are used, since their speed is higher than that of integrated circuits for the same applications. Another factor is that all the transistors are normally operating linearly, whereas many systems have a see-saw type of logic where sections compete as to which are off and on. In this circuit the function is a balance of all active elements being fully active rather than at critical points. Not having to turn from fully on to off and back also contributes to higher speeds. The response happens closer to the event rather than after it, thus avoiding overshooting voltage variations which are passed to become virtual inputs to the amplifiers supplied by the power supply.

(v) The bases of pass transistors 61 and 62 are driven from the opposite polarity supplies. Optionally they can be driven from the common line; either way the voltage dropped while limiting the drive is not dropped in series with the regulator as is more common (when pass transistors' inputs are at their collectors). Voltage dropped across the emitter-base junction is also excluded from this difference between input and output. When the pass transistor is a pair there would be added two emitter base junction voltage-drops to the saturation voltage as the regulator's minimum series voltage drop. Alternative methods also drop voltage in series with the regulator i.e. across limiting resistors such as 69 and 70 in FIG. 6 drop voltage in a manner which is not subtracted from the available output voltage, neither is there series voltage drop across control-transistors 63 and 64.

(vi) Short-circuit and overload immunity from damage is done by the drive for control-transistors 63 and 64 being taken via voltage divider chains from the regulators of opposite polarity, calculated to leave insufficient voltage to enable transistors 63 and 64 to remain on should either regulator's output voltage fall below the calculated allowed minimum. A short-circuit between the two outputs reverse biases 63 and 64 and a short to common or overload reduces drive below the minimum voltage needed to self-sustain both outputs so that they reduce to zero synchronously without increasing current before the turn-off. Alternative systems usually let the current rise to a maximum which is detected, then attempts are made to turn the system off before damage from short-circuits, whereas these systems do not allow a rise above maximum because the drive-current through resistors 69 and 70, 153 and 156 or 270 and 269 ensure that both overloads and short-circuits result in self-regulative shut-down.

(vii) As in (vi) above, the option of driving each polarity from the opposite rather than from common ensures that if either shuts-down (or fails to start) the other is off in synchrony.

(viii) Stability is aided by each logical element in the circuits being on all the time and able to respond in the balance with other elements in small, fast variations rather than large, on/off steps which are slower, lagging in time often enough to cause oscillations. By necessity the output voltage sensing of a regulator will result in adjustment after a time-delay, however this system is fast enough to ensure minimum variation of voltage during changes in current provided without driven elements being slower than driving elements causing overshoot "ringing" type oscillations which follow the sound output of audio amplifiers and add to the amplifiers signal inputs.

Figure 7:
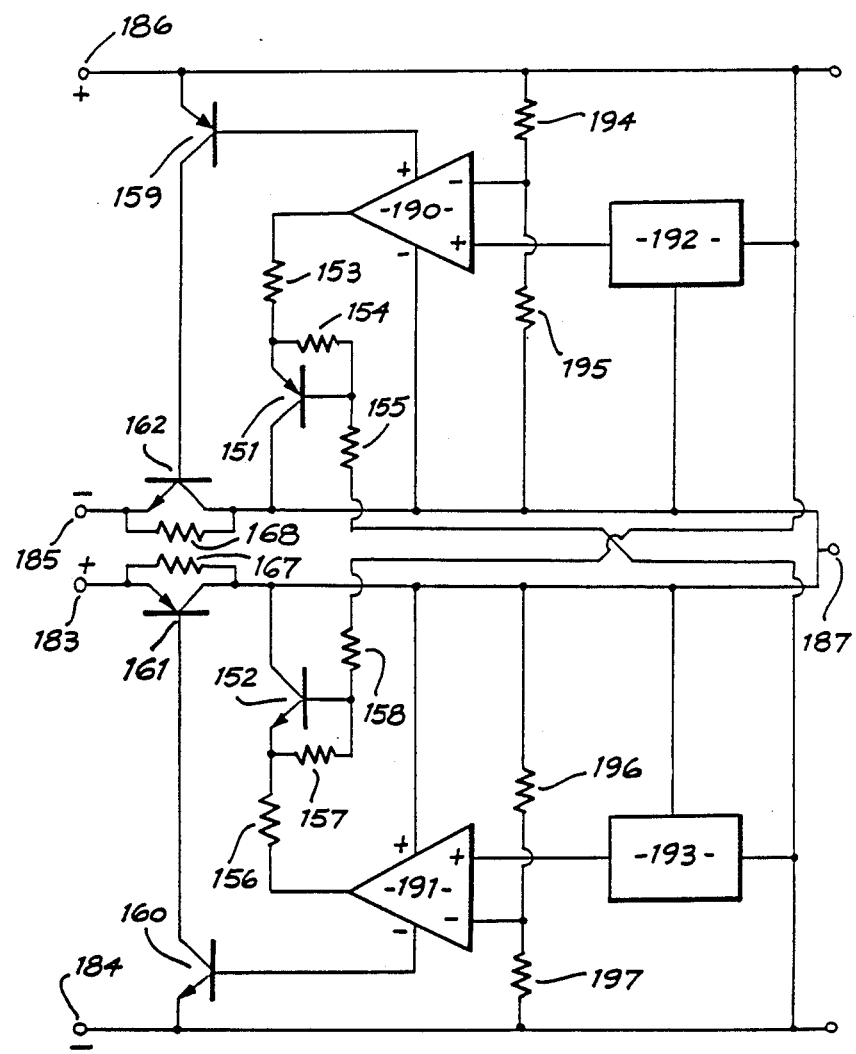
FIG. 7 is a schematic diagram of a second embodiment of the voltage regulator.
Figure 8:
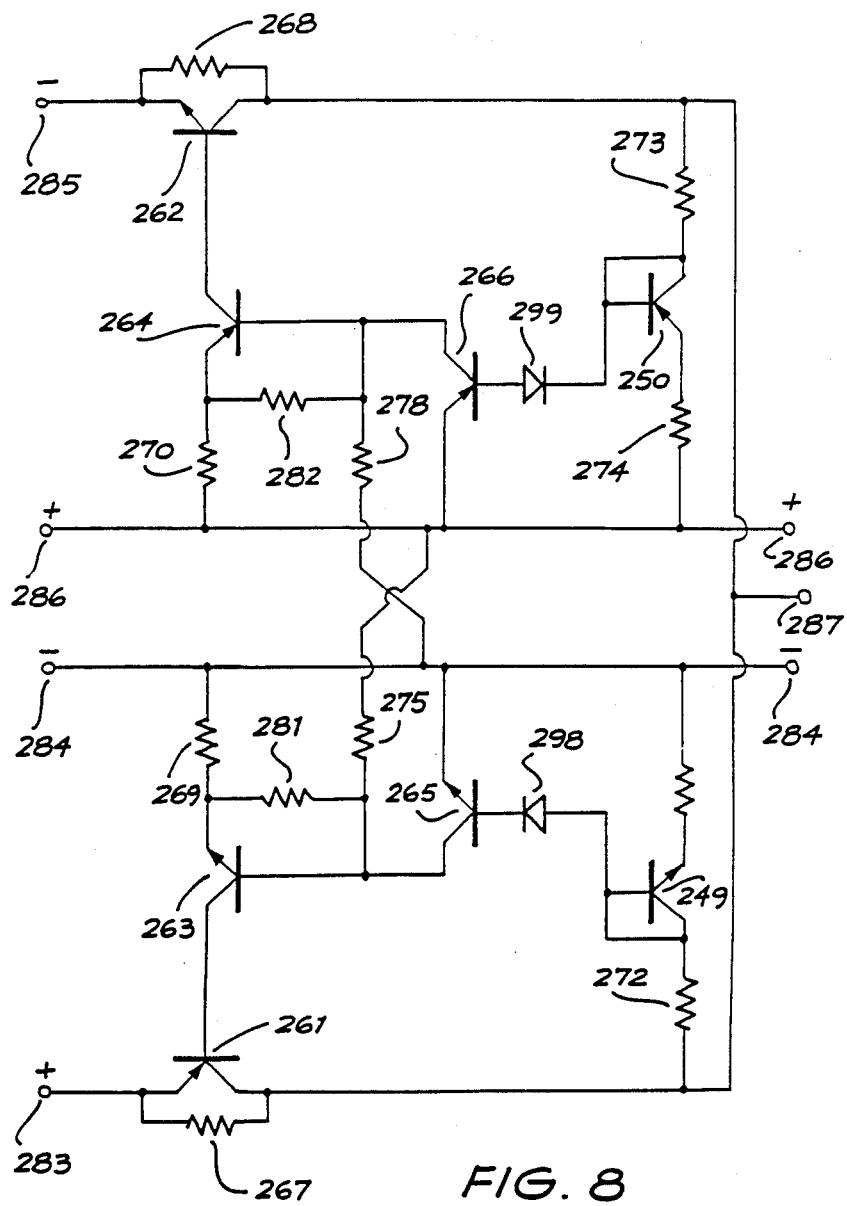
FIG. 8 is a third embodiment of the voltage regulator.

FIG. 7 shows a second embodiment of this regulator which has a slower response to changes in current requirements, but which has better stability of voltage than those shown in both FIGS. 6 and 8. The voltage references 192 (positive) and 193 (negative) are referred to operational amplifiers 190 and 191 (which are slower than discrete transistors) and compared to the required differences 186/187 and 184/187 via divider resistors 194/195 and 196/197. The op-amps conduct into loads 153, 156 via transistors 159, 160 to drive transistors 162, 161 according to current requirements.

Options shown here are that divider-resistor chains 155/154 and 158/157 can turn off transistors 151, 152 ensuring that should for any reason either polarity voltage fall below a calculated minimum the other polarity will also turn off because transistors 151, 152 turn off forming barriers to the drive for transistors 159, 160 via op-amp 190, 191.

An additional feature of this circuit used especially for audio amplifiers is that references 192 and 193 are used to power pre-amplifiers rather than having separate low-voltage extra regulators.

In FIG. 7 as for FIGS. 6 and 8 the regulators are driven from their own opposite-divided outputs, so that short-circuit/overload under-biases or reverse-biases transistors which reduces drive to pass transistors (here 162, 161) before further overload can happen.

In FIGS. 6,7 and 8 the pass transistors are by-passed by resistors 67 and 68 (FIG. 6), 168 and 167 (FIG. 7) 268 and 267 (FIG. 8). These all serve a two-fold purpose, firstly to allow the output to rise enough to establish drive, and secondly to be high enough in resistance to allow only a safe amount of pre-turn-on current for a known normal load in audio amplifers (which these regulators are mostly designed for) so that unless the amplifiers are faulty the regulators will start. If the amplifiers draw too much current via the regulators' by-pass resistors the voltage will be insufficient to let drive develop for the pass transistors, thus limiting the current to only that which can pass through the by-pass resistors, as for example in those cases where condensation or dirt has caused partial short-circuits in the amplifiers whilst having been without power.

FIG. 8 shows a third embodiment of the voltage regulator, namely a temperature stabilised version of FIG. 6. Diodes 299 and 298 add extra voltage-drop above the reference provided by transistors 266 and 265, so that transistors 250 and 249 can vary with temperature in the same way as reference transistors 266 and 265.

Figure 9:
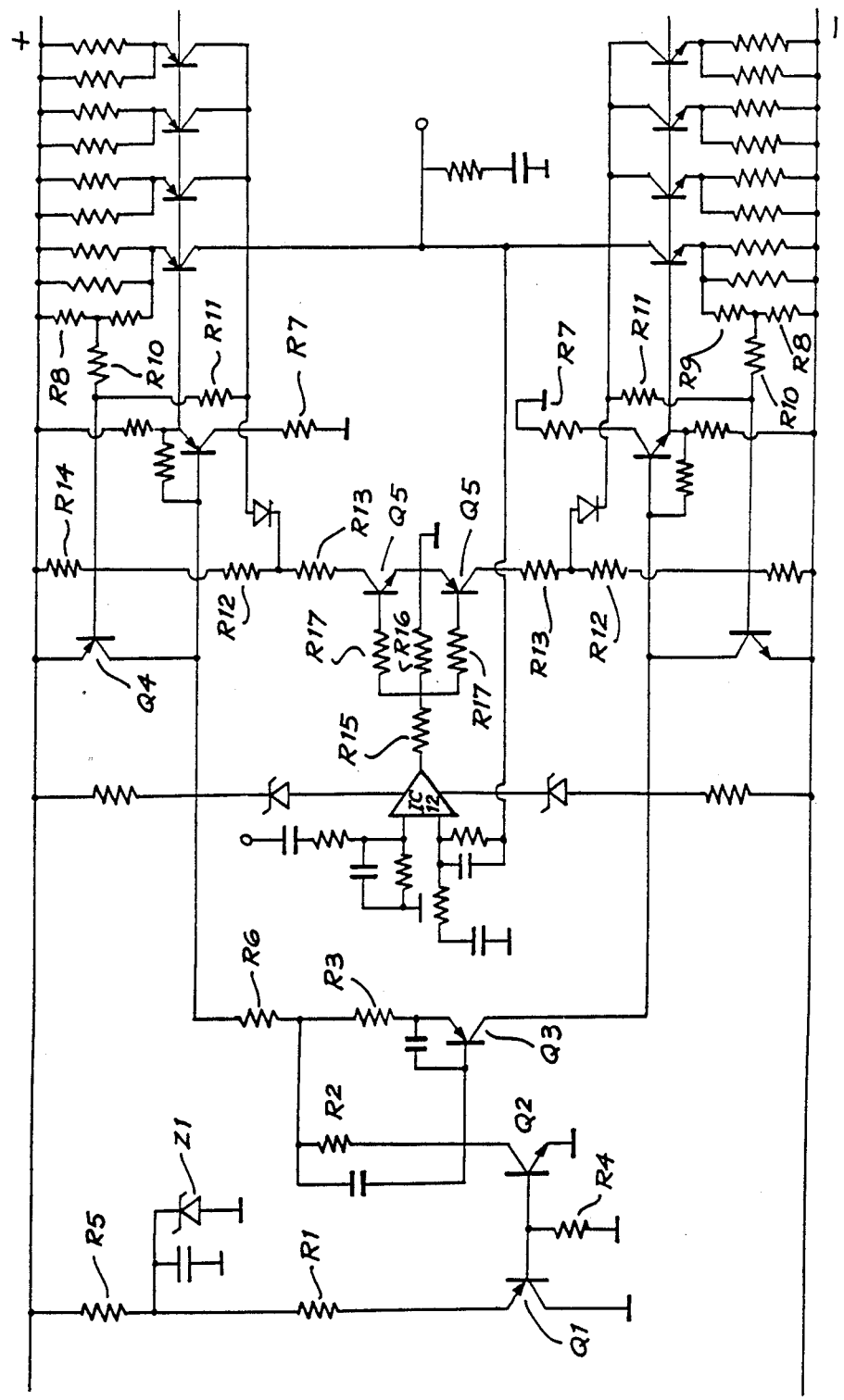
FIG. 9 is a circuit diagram of a second embodiment of the composite power supply and amplifier.

FIG. 9 depicts a second embodiment of the amplifier according to the present invention.

A constant voltage $= VZ_1 - (V_{BE}Q_1 + V_{BE}Q_2)$ appears across $R_1$, ensuring a constant current through $Q_1$ this current is divided by the gain of $Q_1$.

An amount of this current is subtracted by $R_4$ and the rest is multiplied by the gain of $Q_2$. This current appears across $R_2$ as a voltage which also appears across $R_3$ (minus $V_{BE}Q_3$). This voltage across $R_3$ sets the bias current for the output transistors (including the drivers).

$Q_1$ is in contact with the output drivers' heat sink and so follows their temperature.

As these output devices heat up, their gain increases, so requiring less bias current to maintain a constant quiescent output current. This is effected by the fact that $Q_1$'s gain will rise in proportion and pass less current into $Q_2$ and thus less bias current.

$R_4$ ensures that the decrease in current out of $Q_1$'s base compensates, or preferably overcompensates, for the rise in gain of the output devices.

$R_6 + R_3$ sets the maximum current level when the system is cold and $Q_1$ is overcompensating. The output device safe area protection uses the existing emitter resistors.

Maximum current is set by $R_8$ and $R_9$ when $V_{R8} = V_{BE}Q_4$ with no voltage across the output device. Zero current is set by $R_{10}$ and $R_{11}$ when $V_{R10} = V_{BE}Q_4$ for maximum desired voltage across device.

$Q_4$ limits current unless output voltage is below a certain level set by $R_{12}$ and $R_{13}$ when it by-passes the drive to the output devices, then no output current is passed until the next zero crossing of the signal.

The relative merits of the second embodiment amplifier compared with the first embodiment are as follows:

The ability of the protection circuit of the first embodiment to remove drive current is dependent on the gain of the output devices. $Q_5$ turns on (shutting off the drive if the $V_{output}$ is less than a voltage set by $R_{12}$ and $R_{13}$) when the drive current (appearing across $R_{15}$ and $R_{16}$ as a voltage) exceeds a certain amount. This amount depends entirely on the gain, whch is determined by the temperature, of the output devices and so—a reliable safe area protection of these devices, while still using them to their maximum safe area, cannot result from just this circuit.

The additions to the first embodiment circuit are $R_8$, $R_9$, $R_{10}$ and $R_{11}$—which, efficiently and reliably, enable the output transistors to be held within definite safe area limits. The existing circuitry ensures that the output transistors need not dissipate any power during the overload.

$R_7$, although wasting a fraction of potential output current; ensures that the drive stays within its safe area limits; limits the current into the bases of the output transistors; and enables the output to swing to as close to the supply as possible.

Figure 10:
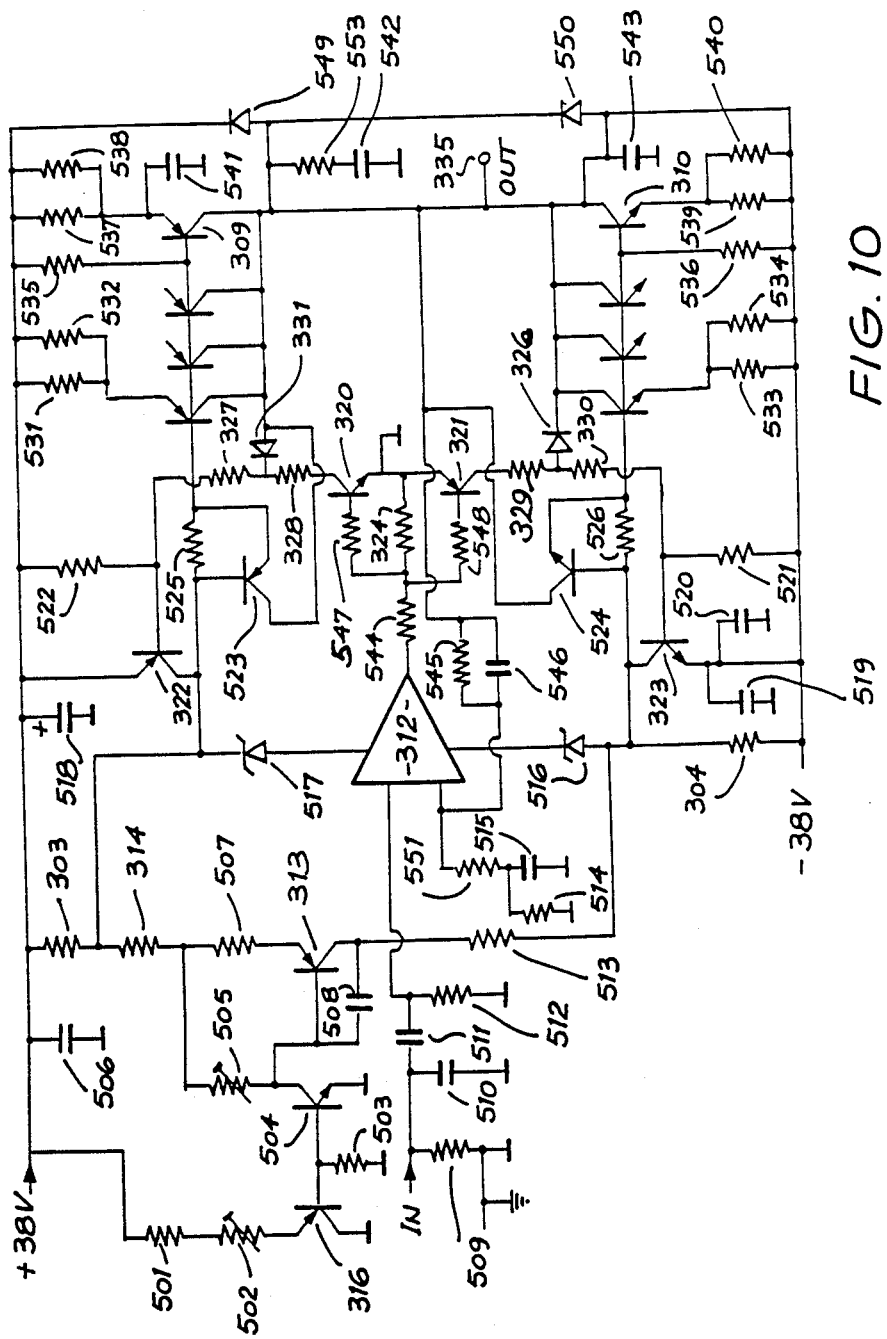
FIGS. 10, 11, and 12 disclose an amplifier, power supply and preamplifiers respectively according to a third embodiment of the composite audio amplifier of the invention.
Figure 11:
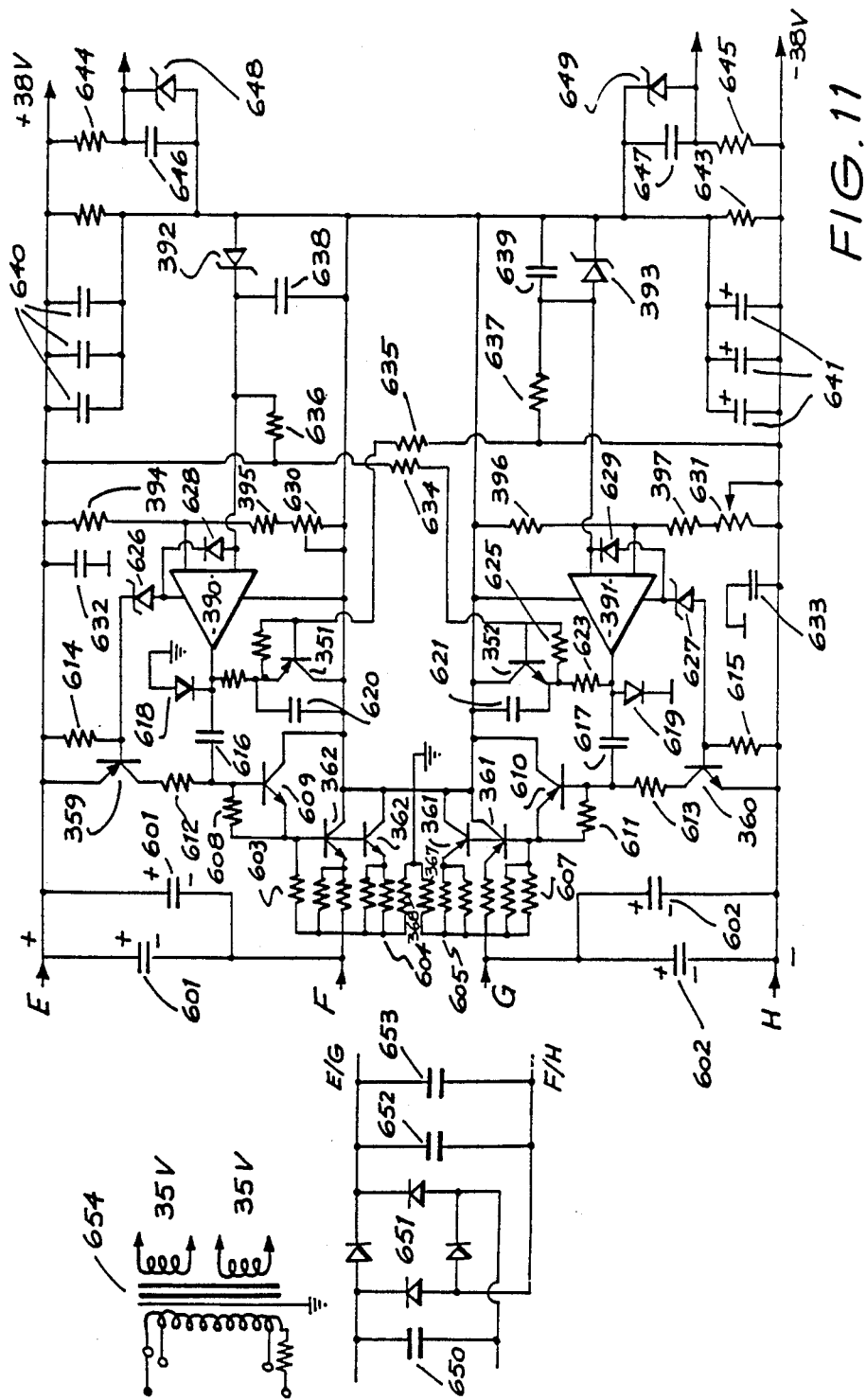
Figure 12:
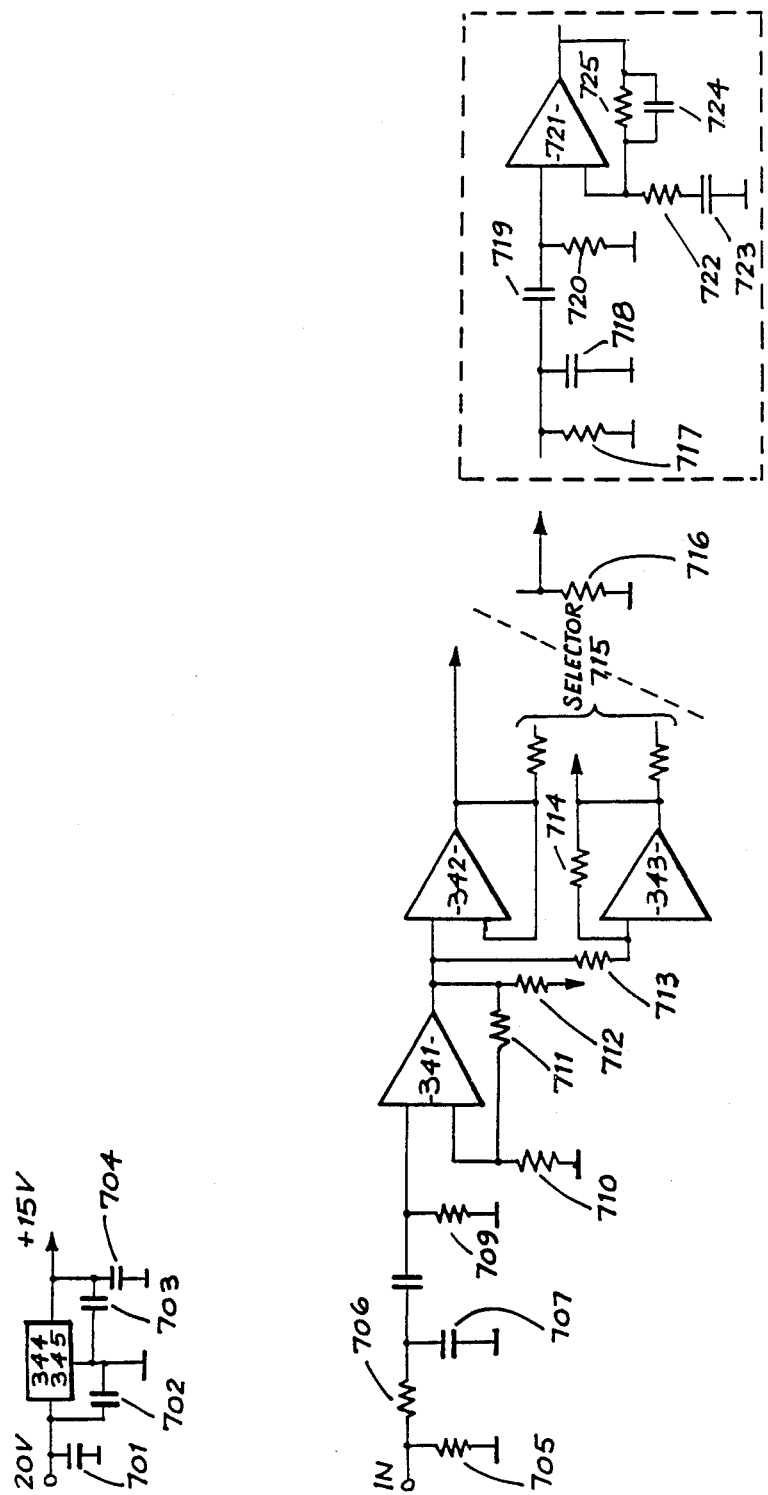

A third embodiment of the invention is shown in FIGS. 10, 11 and 12. The component values are shown in Table 1 (FIG. 10), Table 2 (FIG. 11) and Table 3 (FIG. 12).

Specific characteristics of the third embodiment include the following;

Each channel of the amplifier pair is a mono unit. Each channel's amplifier unit is, in fact, a pair of amplifiers in a bridge configuration.

By use of the twelve position selector switch an input/output voltage ratio of 3:150 maximum is possible. Input impedance is 10K$\Omega$ with a series resistor for line protection.

Voltage drop across the output transistors and series resistors is minimal because the output transistor configuration is Darlington, the output load coming from the collectors.

Zero crossing distortion at operating temperatures into 2 ohms is zero at frequencies at least up to 20 KHz. There is no zero crossing distortion into a 4 ohm load at least up to 75 KHz.

The amplifier of the third embodiment is very stable. There is little or no ringing in the driver stages under clipping overload.

Figure 13:
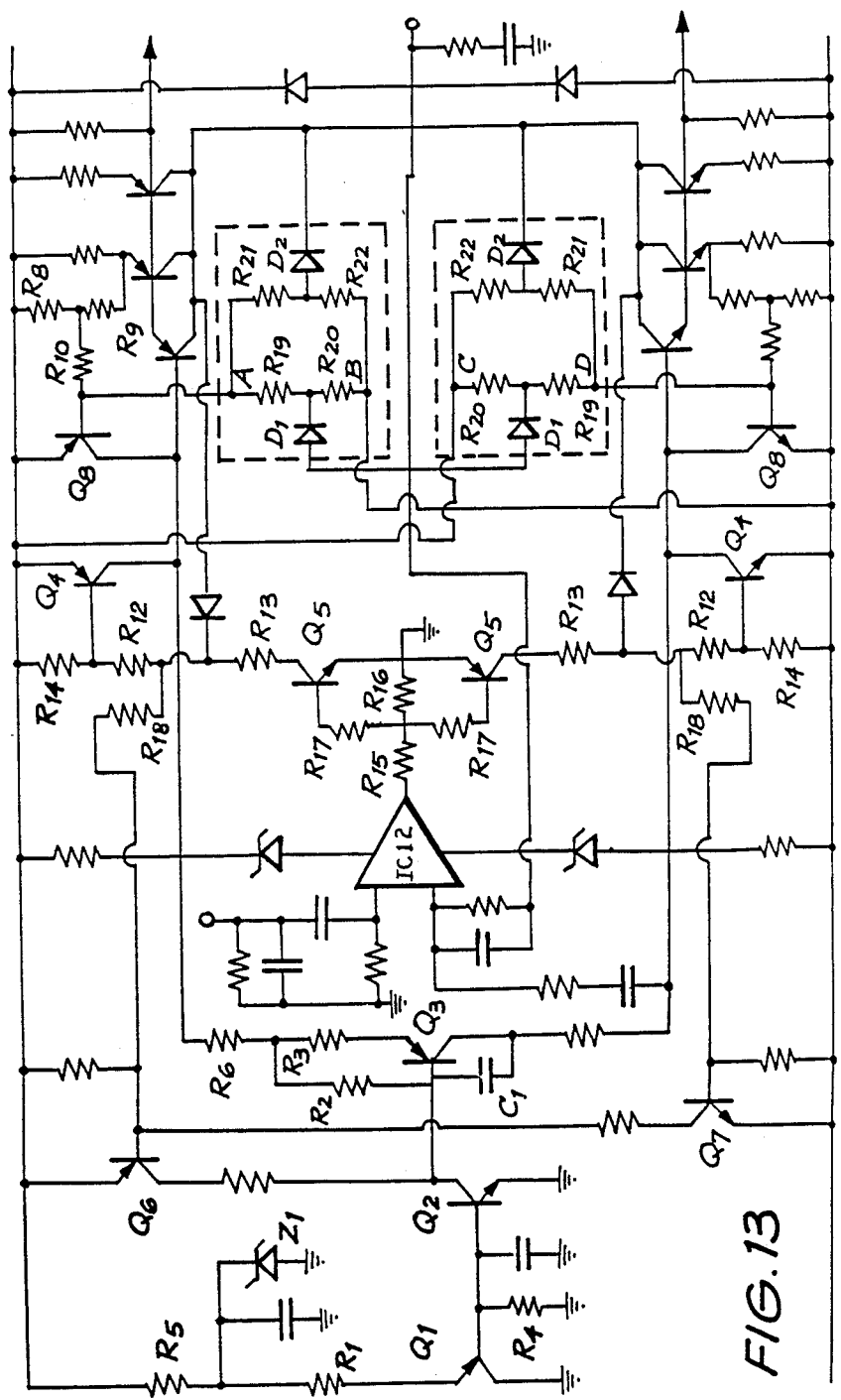
FIG. 13 is a circuit diagram of a fourth embodiment of the amplifier of the present invention.

FIG. 13 is a schematic diagram of a fourth embodiment of the amplifier of the invention.

The networks enclosed in dashed lines in FIG. 13 effectively replace $R_{11}$ of the second embodiment amplifier (FIG. 9). Resistor $R_{19-22}$ and diodes $D_1$ and $D_2$ enable greater use to be made of the safe area of the output devices.

Figure 14:
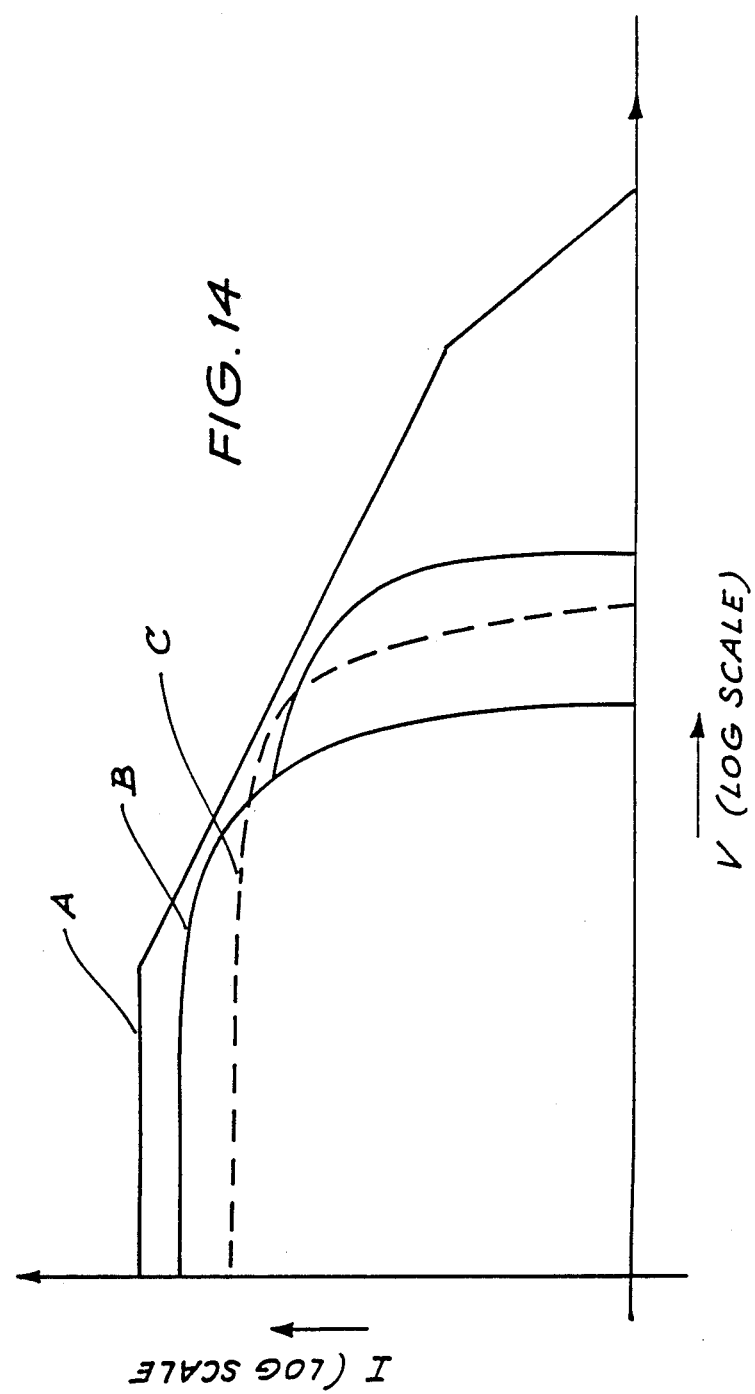
FIG. 14 shows the safe area characteristic of the fourth embodiment of FIG. 13.

FIG. 14 shows the safe area usage. Curve A shows the safe area boundary. The full line curve B shows the safe area usage according to the embodiment of FIG. 13. The dotted line C shows the safe area usage when the previously mentioned resistors and diodes within the dashed boxes in FIG. 13 are replaced by respective resistors (equivalent to $R_{11}$ of FIG. 9).

In FIG. 13 transistor $Q_8$ is shown to be a separate transistor from transistor $Q_4$ and operating only as a current limiting transistor.

The additions of transistors $Q_6$ and $Q_7$ enable the bias to the output stages to be turned off when transistor $Q_4$ by-passes the drive current of IC 12. This feature prevents the output devices which are not already switched off from receiving a full bias current drive.

A further feature of note of the third embodiment amplifier (FIG. 10) and the fourth embodiment amplifier (FIG. 13) is the connection of a collector base capacitor (capacitors 508 and $C_1$ respectively) across the collector base junction of transistors 313 and $Q_3$ respectively of FIGS. 10 and 13 respectively. In contrast to the more usual emitter base capacitor connection the collector base capacitor connection provides for a bias current which increases as frequency increases. I.e. the operating point of the output stages is made dependent upon frequency in such a way that zero crossing distortion is reduced if not entirely eliminated at higher frequencies. In the present case the connector base capacitor should be of the multi layer monolithic type having very small inductance.

The foregoing describes only some embodiments of the present invention and modifications, obvious to those skilled in the art, can be made thereto without parting from the scope and spirit of the present invention.

For example, this amplifier may also be used as a servo-amplifier.

This example should not be taken as limiting. It is envisaged that the amplifier of the present invention may be useful wherever faithful reproduction of input signals is required and combined with an amplifier with self protection characteristics.

It is envisaged that applications will include anywhere where a constant voltage system is needed. The power output system is ideally suited for voltage amplification or constant current (infinite output impedance) voltage-to-current conversion.

TABLE 1
(for FIG. 10)

| Identifying No. | Component Type | Value/Identity |
|---|---|---|
| 303 | R | 270 R |
| 304 | R | 270 R |
| 309 | T | MJ15004 (4 off) |
| 310 | T | MJ15003 (4 off) |
| 312 | OP AMP | 12K |
| 313 | T | BC556 |
| 314 | R | 12K |
| 316 | T | — |
| 320 | T | BC547 |
| 321 | T | BC557 |
| 322 | T | BC557 |
| 323 | T | BC547 |
| 324 | R | 39 R |
| 326 | D | — |
| 327 | R | 6K8 |
| 328 | R | 15K |
| 329 | R | 15K |
| 330 | R | 6K8 |
| 331 | D | — |
| 501 | R | 500K |
| 502 | VR | 500K |
| 503 | R | 1 M |
| 504 | T | — |
| 505 | VR | 27K |
| 506 | C | 1μ |
| 507 | R | 1K |
| 508 | C | 33 n |
| 509 | R | 2K |
| 510 | C | 2n7 |
| 511 | C | 100 n |
| 512 | R | 1m5 |
| 513 | R | 15K |
| 514 | R | 47K |
| 515 | C | 3μ |
| 516 | ZD | Z24 |
| 517 | ZD | Z24 |
| 518 | C | 15Kμ (50 vw) |
| 519 | C | 15Kμ (50 vw) |
| 520 | C | 1μ |
| 521 | R | 2K7 |
| 522 | R | 2K7 |
| 523 | T | TIP42C |
| 524 | T | TIP41C |
| 525 | R | 2K7 |
| 526 | R | 2K7 |
| 531 | R | R22 (¼ W) metal film |
| 532 | R | R22 (¼ W) metal film |
| 533 | R | R22 (¼ W) metal film |
| 534 | R | R22 (¼ W) metal film |
| 535 | R | 39 R |
| 536 | R | 39 R |
| 537 | R | R22 |
| 538 | R | R22 |
| 539 | R | R22 |
| 540 | R | R22 |
| 541 | C | 1μ |
| 542 | C | 150 n |
| 543 | C | 1μ |
| 544 | R | 470 R |
| 545 | R | 270K |
| 546 | R | 4p7 |
| 547 | R | 1K |
| 548 | R | 1K |
| 549 | D | — (rated 3 A) |
| 550 | D | — (rated 3 A) |
| 551 | R | 5K6 |
| 552 | R | — |
| 553 | R | 22 R 5 W |

TABLE 2
(for FIG. 11)

| Identifying No. | Component Type | Value/Identity |
|---|---|---|
| 351 | T | BC557 |
| 352 | T | BC547 |
| 359 | T | BD140 |
| 360 | T | BD139 |
| 361 | T | MJ15004 |
| 362 | T | MJ15003 |
| 367 | R | 120 R 5 W |
| 368 | R | 120 R 5 W |
| 390 | IC | TL071 |
| 391 | IC | TL071 |
| 392 | IC | LM329 |
| 393 | ZD | 6V9 |
| 394 | R | 42K |
| 395 | R | 6K8 |
| 396 | R | 42K |
| 397 | R | 6K8 |
| 601 | C | 15,000μ 50 VW |
| 602 | C | 15,000μ 50 VW |
| 603 | R | 39 R |
| 604 | R | — 4 off |
| 605 | R | — 4 off |
| 606 | R | — |
| 607 | R | R22 2 off |
| 608 | R | 2K7 |
| 609 | T | TIP41C |
| 610 | T | TIP42C |
| 611 | R | — |
| 612 | R | 2K7 |
| 613 | R | — |
| 614 | R | 39 R |
| 615 | R | — |
| 616 | C | 33 n |
| 617 | C | 33 n |
| 618 | D | — |
| 619 | D | — |
| 620 | C | — |
| 621 | C | — |
| 622 | R | 110 R |
| 623 | R | 110 R |
| 624 | R | 2K7 |
| 625 | R | 2K7 |
| 626 | ZD | Z10 V |
| 627 | ZD | Z10 V |
| 628 | D | — |
| 629 | D | — |
| 630 | VR | 5K 20 t |
| 631 | VR | 5K 20 t |
| 632 | C | 1μ |
| 633 | C | 1μ |
| 634 | R | 100K |
| 635 | R | 100K |
| 636 | R | 27K |
| 637 | R | 27K |
| 638 | C | 100 n |
| 639 | C | 100 n |
| 640 | C | 470μ 63 V (multiple) |
| 641 | C | 470μ 63 V (multiple) |
| 642 | R | 1K2 5 W |
| 643 | R | 1K2 5 W |
| 644 | R | 470 R 5 W |
| 645 | R | 470 R 5 W |
| 646 | C | 100 n |
| 647 | C | 100 n |
| 648 | ZD | Z20 V |
| 649 | ZD | Z20 V |
| 650 | C | 47 n |
| 651 | BRIDGE RECTIFIER | 25 A, 400 V-MDA2504 |
| 652 | C | 27 n |
| 653 | C | 47 n |
| 654 | POWER TRANSFORMER | 35 V, 100 VA dual output |

TABLE 3A
(for FIG. 12)

| Identifying No. | Component Type | Value/Identity |
|---|---|---|
| 344, 345 | I.C. Regulator | 7915 negative, |

TABLE 3A-continued (for FIG. 12)

| Identifying No. | Component Type | Value/Identity |
|---|---|---|
|  |  | .7815 positive |
| 341, 342, 343 | I.C. OP AMP | TL071 |
| 701 | C | 470µ 16 V |
| 702 | C | 100 n |
| 703 | C | 100 n |
| 704 | C | 470µ 16 V (multiple) |
| 705 | R | 10K |
| 706 | R | 10K |
| 707 | R | 10K |
| 708 | C | 100 n |
| 709 | R | 1M5 |
| 710 | R | 100K |
| 711 | R | 147K |
| 712 | R | 4K7 |
| 713 | R | 150K |
| 714 | R | 150K |
| 715 | SELECTOR | 2 POLE, 12 POSITION - refer table 3B |
| 716 | R | 2K |
| 717 | R | 2K |
| 718 | C | 2n7 |
| 719 | C | 100 n |
| 720* | R | 1M5 |
| 721 | I.C. OP AMP | TL071 |
| 722 | R | 5K62 |
| 723 | C | 3µ |
| 724 | C | 4p7 |
| 725 | R | 274K |

TABLE 3B

Component 715 - SELECTOR

| O'Clock Switch Position | Series Resistor Value | | |
|---|---|---|---|
| 7 | 432 | 431K | 392K |
| 8 | 288 | 287K | 279K |
| 9 | 192 | 191K | 182K |
| 10 | 128 | 127K | 121K |
| 11 | 85 | 84K | 82K5 |
| 12 o'clock | 57 | 56K | 56K2 |
| 1 | 38 | 37K | 34K |
| 2 | 25.3 | 24K | 26K1 |
| 3 | 16.9 | 16K | 15K1 |
| 4 | 11.3 | 10K1 | 10K |
| 5 | 7.5 | 6K5 |  |
| 6 | 4.9 | 3K9 | 3K92 |

I claim:

1. A composite audio amplifier comprising at least one symmetrical, dual polarity audio amplifier power supply and a class AB audio amplifier circuit, said symmetrical, dual polarity audio amplifier power supply comprising first positive and negative and second positive and negative unregulated DC inputs;

positive and negative regulated outputs and a common output;

a first and a second regulator circuit;

said first regulator circuit including at least one pass transistor having its emitter connected to said first negative unregulated DC input and its collector connected to said common ouput, said second regulator circuit including at least one pass transistor having its emitter connected to said positive unregulated DC input and its collector connected to said common output;

each said pass transistor having a pass resistor connected between the emitter and collector of said pass transistor;

said first regulator circuit deriving a reference signal from said negative regulated output and said second regulator circuit deriving a reference from said positive regulated output;

said first and second regulator circuit deriving power from said positive regulated output and common and said negative regulated output and common respectively;

said class AB audio amplifier circuit comprising in combination a primary operational amplifier driving complementary power transistor output stages;

bias current for said complementary power transistor output stages including bias current adjustment means to adjust said bias current in response to the temperature of at least one of a power transistor forming part of said complementary power transistor output stages;

the signal output of said primary operational amplifier being fed to complementary symmetric first and second arms of a current shunt network, said current shunt network adapted to shunt base current from said complementary power transistor output stages when said signal output of said primary operational amplifier exceeds a preset maximum threshold and, at the same time, said signal from said power output drops below a preset minimum threshold;

said current shunt network adapted to allow transient overload conditions.

2. The composite audio amplifier of claim 1 wherein said symmetrical, dual polarity audio amplifer power supply further comprises said positive regulated output being positive with respect to said common output and said negative regulated output being negative with respect to said common output;

said first regulator circuit including at least one pass transistor having its emitter connected to said first negative unregulated DC input and its collector connected to said common output, said second regulator circuit including at least one pass transistor having its emitter connected to said second positive unregulated DC input and its collector connected to said common output;

the base of said at least one pass transistor of said first regulator circuit being connected to a first regulating means, said first regulating means deriving reference signals from a first primary reference source and a first secondary reference source, and first primary reference source associated with said positive regulated output and said common output, said first secondary reference source associated with said negative regulated output;

the base of said at least one pass transistor of said second regulator circuit being connected to a second regulating means, said second regulating means deriving reference signals from a second primary reference source and a second secondary reference source, said second primary reference source associated with said negative regulated output and said common output, said secondary reference associated with said positive regulated output;

and said pass transistor having a pass resistor connected between the emitter and collector of said pass transistor.

3. The composite audio amplifier of claim 2 wherein said first positive unregulated input is connected directly to said positive regulated output and said negative unregulated input is connected directly to said negative regulated output.

4. The composite audio amplifier of claim 2 wherein said first and second primary reference source comprise a resistive voltage divider connected between said positive regulated output and common and said negative regulated output and common respectively.

5. The composite audio amplifier of claim 3 wherein said first and second secondary reference source comprise one or more resistors connected directly to said negative regulated output and said positive regulated output respectively.

6. The composite audio amplifier of claim 2 wherein said first and second regulator means comprise, respectively, a driver transistor whose collector is connected to said base of said pass transistor, and whose emitter is connected by way of a resistor to said first positive unregulated input and said second negative unregulated input respectively, and whose base is connected to the collector of a regulator transistor, the emitter of said regulator transistor being connected to said first positive unregulated input and said second negative unregulated input respectively, the base of said regulator transistor being connected to said first and second primary reference source respectively, wherein said first and second primary reference source comprise respectively a resistive voltage divider connected between said positive regulated output and common and said negative regulated output and common respectively, said base of said driver transistor also connected by means of a resistor network to said positive regulated output and said negative regulated output respectively.

7. The composite audio amplifier of claim 3 wherein said first and second regulating means comprise, respectively, a driver transistor and an operational amplifier;
the collector of said driver transistor connected to the base of said pass transistor, the emitter of said drive transistor connected to said first positive unregulated input and said second negative unregulated input respectively, the base of said driver transistor connected to, respectively, the positive supply input and the negative supply input of said operational amplifier;
the negative and positive supply inputs, respectively, of said operational amplifier be connected to said common output;
said first and second primary referenced source comprising, respectively, an integrated circuit regulated input to the non-inverting input of said operational amplifier, said integrated circuit regulator deriving from said positive regulated output and common and said negative regulated output and common respectively, and a resistive voltage divider connected between said positive regulated output and common and said negative regulated output and common respectively the output of which is connected to the inverting input of said operational amplifier;
said first and second secondary reference source comprising, respectively, a transistor whose emitter is connected via a resistor to the output of said operational amplifier, the collecter of said transistor being connected to said common output respectively, the base of said transistor being connected via a resistive network to said negative regulated output and said positive regulated output respectively, an emitter base resister being connected between the emitter and base of said transistor.

8. The composite audio amplifier of claim 3 wherein said first regulating means and said second regulating means comprise, respectively, a driver transistor whose collector is connected to the base of the said power transistor, the emitter of said driver transistor being connected to said first positive unregulated input and said second negative unregulated input respectively, the base of said driver transistor being connected to the collector of a second driver transistor, the emitter of said second driver transistor be connected to said positive regulated output and said negative regulated output respectively, a base emitter resistor be connected between the base and emitter of said driver transistor;
said first primary reference source and said second primary reference source comprising, respectively, a first resistor having a first end connected to said common output and having a second end connected to the collector of a reference transistor, the emitter of said reference transistor being connected to a first and a second resistor, the second end of said second resistor being connected to said positive regulated output and said negative regulated output respectively, the base of said regulated transistor being connected via a normally forward bias current to the base of said second driver transistor, a further connection being made between the collector and base of said reference transistor;
said first and second secondary reference sources comprising, respectively, connection via a resistor to said negative regulated output and said positive regulated output respectively.

9. The composite audio amplifier of claim 2 wherein more than one pass transistor is used in a parallel arrangement.

10. The composite audio amplifer of claim 1 wherein said power supply comprises more than one of said first and second regulator circuits, respectively, connected in series between said first negative unregulated input and said second positive unregulated input respectively and said common output.

11. The composite audio amplifier of claim 1 wherein said class AB audio amplifier circuit comprises in combination
a primary operational amplifier driving complementary power transistor output stages;
said audio amplifier circuit having a power output connected between the collectors of the transistor(s) comprising said complementary power transistor output stage;
said primary operational amplifier having an audio signal input from a pre-amplifier fed to its non-inverting input;
said primary operational amplifier having a signal from said power output applied by way of a resistive voltage divider network to the inverting input of said primary operational amplifier;
the bias current for said complementary power transistor output stages including bias current adjustment means to adjust said bias current in response to the temperature of at least one of a power transistor forming part of said complementary power transistor output stages;
said bias current adjustment means being in temperature communication with said at least one of a power transistor output stages and influenced thereby such that increasing temperature of said at least one of a power transistor causes said bias current adjustment means to reduce the bias current such that the operating point of said complementary power transistor output stages is maintained at approximately a predetermined operating point independent of the temperature of said at least one of a power transistor forming part of said complementary power transistor output stages;

the signal output of said primary operational amplifier being fed by way of a dummy load resistor to complementary symmetric first and second arms of a current shunt network, said current shunt network adapted to shunt base current from said complementary power transistor output stages when said signal output of said primary operational amplifier exceeds a preset maximum threshold and, at the same time, said signal from said power output drops below a preset minimum threshold;

said current shunt network adapted to allow transient overload conditions.

12. The composite audio amplifier circuit of claim 11 wherein said complementary symmetric first and second arms of a current shunt network comprise, respectively, a resistive divider network connected in series to the collector of a transistor, the emitter of said transistor connected respectively, to said common output of said power supply, the opposite end of said resistive divider network be connected to said positive regulated output and said negative regulated output respectively of said power supply, the base of said transistor being connected, respectively, by means of resistive elements to said primary operational amplifier signal output, said resistive divider network being biased by a connection to said power output of said audio amplifier circuit, said resitive divider network being further connected to the base of an additional transistor, the emitter of said additional transistor being connected, respectively, to said positive regulated output and said negative regulated output of said power supply, the collector of said additional transistor being connected to said bias current supply circuit to shunt at least a portion of said bias current away from said complementary power transistor output stages when said additional transistors are turned on during overload conditions as previously defined.

13. The composite audio amplifier of claim 11 wherein said bias current supply circuit is arranged to supply increasing bias current at increasing frequency by means of a collector base capacitor connected across the collector base junction of a primary bias current controlling transistor.

* * * * *